(12) United States Patent
Cooney, III et al.

(10) Patent No.: US 6,339,258 B1
(45) Date of Patent: Jan. 15, 2002

(54) LOW RESISTIVITY TANTALUM

(75) Inventors: Edward Crandal Cooney, III, Jericho, VT (US); Cyprian Emeka Uzoh, Milpitas, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/347,221

(22) Filed: Jul. 2, 1999

(51) Int. Cl.[7] .......................... H01L 23/48; H01L 23/52
(52) U.S. Cl. .................... 257/762; 257/751; 257/758
(58) Field of Search ................... 257/762, 750, 257/751, 758; 438/627, 643, 653, 927, 687

(56) References Cited

U.S. PATENT DOCUMENTS

| | | | |
|---|---|---|---|
| 5,447,887 A | 9/1995 | Filipiak et al. | 437/200 |
| 5,470,789 A | 11/1995 | Misawa | 437/190 |
| 5,506,449 A | 4/1996 | Nakano et al. | 257/758 |
| 5,614,437 A | 3/1997 | Choudhury | 437/140 |
| 5,665,628 A | 9/1997 | Summerfelt | 438/3 |
| 5,668,411 A | 9/1997 | Hong et al. | 257/751 |
| 5,679,980 A | 10/1997 | Summerfelt | 257/751 |
| 5,686,760 A | 11/1997 | Miyakawa | 257/751 |
| 5,696,018 A | 12/1997 | Summerfelt et al. | 437/60 |
| 6,110,598 A | * 8/2000 | Maeda et al. | 428/457 |

FOREIGN PATENT DOCUMENTS

| | | | |
|---|---|---|---|
| EP | 0 751 566 | * 2/1997 | 257/762 |
| JP | 55-132056 | 10/1980 | |
| JP | 63-156341 | 6/1988 | |
| JP | 6-275-622 | 9/1994 | |
| JP | 6-310509 | 11/1994 | |
| JP | 6-318591 | 11/1994 | |
| JP | 11-340228 | * 12/1999 | |

OTHER PUBLICATIONS

Luther et al, Planar Copper–Polyimide Back End of the Line Interconnections for ULSI Devices, VMIC Conference, Jun. 8–9, 1993, 15–21.

Method of Eliminating Ta Hydride Formation During Cu Plating on Ta Films, IBM TDB, vol. 34, No. 7A, Dec. 1991, 284.

* cited by examiner

Primary Examiner—Jhihan B. Clark
(74) Attorney, Agent, or Firm—Connolly Bove Lodge & Hutz; Joseph P. Abate

(57) ABSTRACT

An alpha-phase tantalum having a resistivity of about 15 micro-ohm-cm or less is provided and is especially useful as a barrier layer for copper and copper alloy interconnections.

17 Claims, 2 Drawing Sheets

LOW RESISTIVITY TANTALUM

TECHNICAL FIELD

The present invention relates to an alpha-phase tantalum exhibiting relatively low resistivity and a high degree of orientation and a method for fabricating the alpha-phase tantalum. In addition, the alpha-phase tantalum according to the present invention is especially useful as a barrier layer and particularly in copper chip interconnection structures. Furthermore, the alpha-phase tantalum acts as a redundant current layer in such structures and finds use in chip structures, packaging, flat panel displays and in magnetics.

BACKGROUND OF INVENTION

Aluminum and its related alloy, AlCu, are currently the predominantly used conductors for forming interconnection from electronic devices such as integrated circuits. The amount of Cu in AlCu is typically in the range of about 0.3 to about 4%.

Replacement of AlCu by Cu and Cu alloys as a chip interconnection material results in advantages of improved chip performance. Performance is improved because the resistivity of Cu and in certain copper alloys is less than the resistivity of AlCu. Besides performance, high chip yield count and higher circuit wiring densities are also realized.

In addition, interest in using copper as interconnects in semiconductor devices has increased since it possesses a reduced susceptibility to electromigration failure as compared to the more traditional aluminum or aluminum alloy interconnects.

The advantages of copper metallization have been recognized by the entire semiconductor industry. Copper metallization has been the subject of extensive research documented by two entire issues of the *Materials Research Society* (*MRS*) Bulletin. One dedicated to academic research on the subject is *MRS Bulletin*, Vol. XVIII, No. 6 (June 1993) and the other dedicated to industrial research in *MRS Bulletin*, Vol. XIX, No. 8 (August 1994). A 1993 paper by Luther et al, "Planar Copper-Polyamide Back End of the Line Interconnection for ULSI Devices", in *Proc. IEEE VLSI Multilevel Interconnections Conference*, Santa Clara, Calif., Jun. 8–9, 1993, p. 15, describes the fabrication of copper chip interconnections with four levels of metallization.

However, since copper has a tendency when used in interconnect metallurgy to diffuse into surrounding dielectric materials such as silicon dioxide, encapsulation of the copper is essential. The capping inhibits this diffusion. One widely suggested method of capping includes employing a conductive barrier layer along the sidewalls and bottom surface of a copper interconnect. Typical of such barrier layers is tantalum and titanium, and nitrides thereof. Capping of the upper surface of a copper interconnect usually employs silicon nitride.

The tantalum employed is typically an alpha-phase tantalum layer, which besides acting as a barrier, also acts as a redundant current carrier layer to assist the main conductor copper in current distribution. Moreover, it becomes the main conductor in the event the copper fails due to electromigration. However, the resistivity of the presently available alpha-phase tantalum layer is typically about 25 micro ohm-cm. Although this resistivity is adequate, it leaves room for improvement. Accordingly, it would be desirable to reduce the resistivity of the redundant conducting layer to be as low as practical.

SUMMARY OF INVENTION

The present invention relates to a tantalum layer having significantly reduced resistivity. In addition, the tantalum layer according to the present invention has a high degree of orientation. More particularly, the present invention relates to an alpha-phase tantalum having a resistivity of about 15 micro-ohm-cm or lower.

The present invention also relates to a process for preparing the tantalum of the present invention. In particular, the process involves sputter deposition of tantalum employing a vacuum of at least about 1×10 E6 torr, power of about 0.5 to about 6 kilowatts, in the presence of an inert gas to provide an effective pressure of about 1 to about 10 millitorr.

The present invention also relates to an interconnection structure for semiconductor integrated circuits which comprises a layer of copper or copper alloy and a barrier layer of alpha-phase tantalum having a resistivity of about 15 micro-ohm-cm or less.

A further aspect of the present invention relates to an alpha-phase tantalum obtained by the above described process.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

In order to facilitate an understanding of the present invention, reference will be made to the figures.

Figure 1:
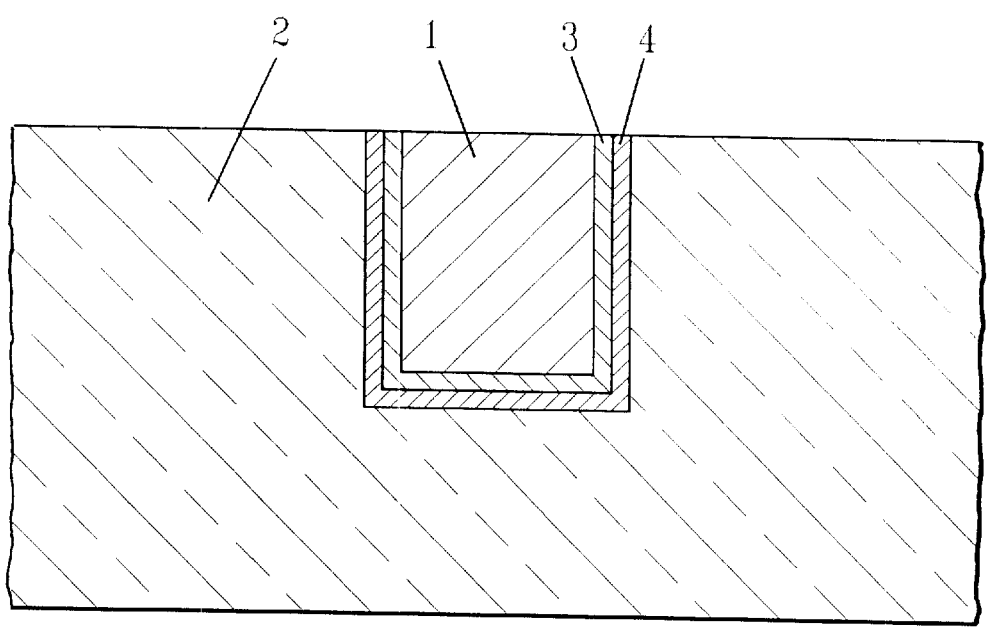
FIG. 1 is a schematic diagram of a semiconductor structure in accordance with the present invention.

As illustrated in FIG. 1, copper wiring 1 is included on a semiconductor wafer (not shown) such as silicon, silicon-germanium alloys, silicon carbide, or gallium arsenide. The copper wiring 1 is electrically isolated by including an interlevel dielectric 2 such as silicon dioxide ($SiO_2$), phosphosilicate-glass (PSG), boron doped PSG (BDPSG) or tetraethylorthosilicate (TEOS). In addition, the dielectric can include low dielectric constant materials such as fluorinated $SiO_2$, organic polymers and porous dielectrics.

Figure 2:
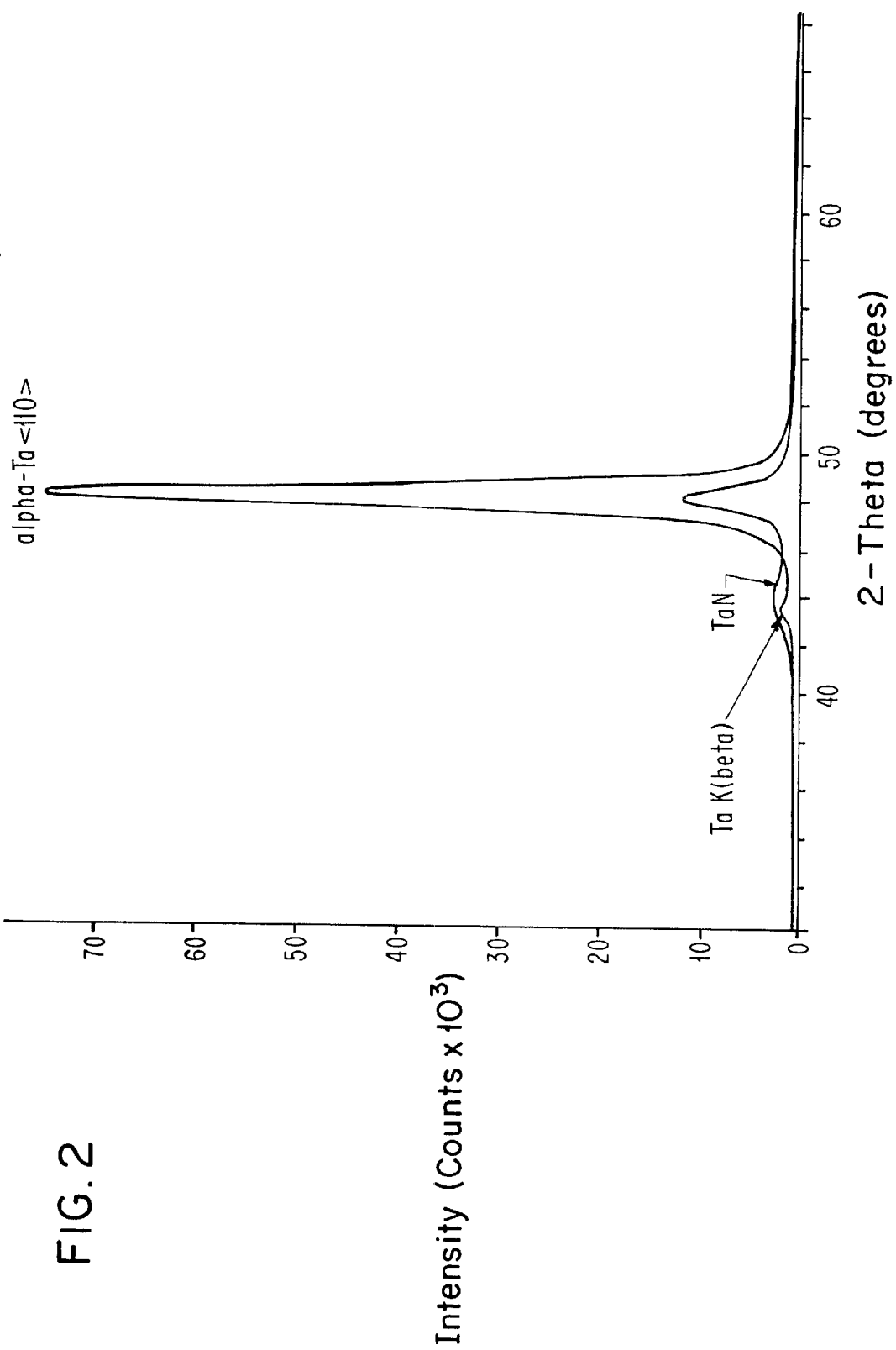
FIG. 2 is an x-ray diffraction spectra for the alpha-tantalum of the present invention.

According to the present invention, a barrier layer 3 of the alpha-phase tantalum of the present invention is employed along the bottom and side wall surfaces of the copper wiring 1 between the copper wiring 1 and insulator 2. The copper wiring layer is typically about 1000 to about 20,000 Å thick. The alpha-phase tantalum of the present invention has low resistivity of about 15 micron-ohm-cm or lower and is used both as the barrier layer and redundant current carrying layer. Furthermore, the alpha-phase tantalum layer, according to the present invention, preferably is a relatively highly oriented film and has a <110> diffraction peak at about 49° (2-theta) as demonstrated in FIG. 2. The x-ray-diffraction spectra is measured by depositing a layer of the alpha-phase tantalum to a thickness of a few hundred angstroms, such as about 400 Å, overtop a substrate of tantalum nitride using the process conditions to be discussed below. A 2-theta style x-ray-diffraction (XRD) scan is then performed and as shown in FIG. 2, the resulting spectra contains a very narrow diffraction peak. For an XRD set up using monochromatic iron radiation from a sealed tube source operating at 35 kilovolts and 35 milliamps, a <110> diffraction peak at about 49° (2-theta) is generated. This confirms the highly oriented nature of the alpha-phase tantalum film according to the present invention.

The alpha-phase tantalum layer of the present invention can be produced by employing sputter machines such as that available under the trade designation Endura 5500 from Applied Materials Corporation or sputter machines available from Novellus Corporation. Such are well known and need not be described herein in any detail. Typically, the sputter apparatus for purposes of the present invention use a DC magnetron source configuration and use as the source of tantalum, tantalum having a purity of about 99.9% or greater. In carrying out the process, an inert gas such as argon at a flow rate of about 50 to about 130 standard cubic centimeters per minute (sccm) is injected into the process cavity which contains the target along with the wafer upon which the tantalum is to be deposited. The process cavity prior to injection of the inert gas was previously evacuated to a vacuum level of at least 1.0×10 E6 torr using for example a cryogenic pump. Simultaneous to flowing the inert sputter gas, an additional gas flow of nitrogen is also begun at a flow rate of about 20 to about 60 standard cubic centimeters per minute. The process cavity is filled with both gases to achieve an effective pressure of about 1 to about 10 millitorr. The power typically employed to create a plasma for the purposes of the present invention is between about 0.5 and about 6 kilowatts, and preferably about 2 to about 3 kilowatts. Any combination of target voltage and current to achieve this power level can be employed. The material deposited is the highly oriented alpha-phase tantalum material of the present invention. The deposition rate is typically about 1000 to about 2000 Å per minute and more typically about 1200 to about 1500 Å per minute.

In a typical interconnection structure, the thickness of the alpha-phase tantalum barrier layer 3 is about 50 to about 300 Å and more typically about 100 to about 200 Å.

Additionally, and optionally, as illustrated in FIG. 1, a second barrier layer 4 is present between the alpha-tantalum barrier layer 3 and insulator 2. This second barrier layer 4 is typically tantalum nitride, tantalum silicon, tantalum silicon nitride, titanium nitride, tungsten or tungsten nitride. The thickness of barrier layer 4 is typically about 25 to about 300 Å and more typically about 50 to about 100 Å.

The following non-limiting examples are presented to further illustrate the present invention.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. Alpha-phase tantalum having a resistivity of less than 15 micro-ohm-cm.

2. The alpha-phase tantalum of claim 1 having a <110> diffraction peak at about 49° (2-theta) as measured by x-ray diffraction using monochromatic iron radiation from a sealed tube source operating at 35 kilovolts and 35 milliamps.

3. The alpha-phase tantalum of claim 2 having the x-ray diffraction spectra as shown in FIG. 2.

4. An interconnection structure for semiconductor integrated circuits which comprises a layer of copper or copper alloy and a barrier layer of alpha-phase tantalum having a resistivity of less than 15 micro-ohm-cm.

5. The interconnection structure of claim 4 wherein the alpha-phase tantalum has a <110> diffraction peak at about 45° (2-theta) obtained by an x-ray diffraction scan using monochromatic iron radiation from a sealed tube source operating at 35 kilovolts and 35 milliamps.

6. The interconnection structure of claim 4 wherein the alpha-phase tantalum has an x-ray diffraction scan shown in FIG. 2.

7. The interconnection structure of claim 4 which further includes electrical isolation and wherein the barrier layer separates the copper from the isolation.

8. The interconnection structure of claim 4 wherein the thickness of the copper is about 200 to about 1500 Å.

9. The interconnection structure of claim 4 wherein the thickness of the alpha-phase tantalum layer is about 50 to about 300 Å.

10. The interconnection structure of claim 7 which further includes a second barrier layer between the insulation and the alpha-phase tantalum.

11. The interconnection structure of claim 10 wherein the second barrier layer is selected from the group consisting of tantalum nitride, tantalum silicon, tantalum silicon nitride, titanium nitride, tungsten and tungsten nitride.

12. The interconnection structure of claim 10 wherein the second barrier layer is tantalum nitride or titanium nitride.

13. The interconnection structure of claim 10 wherein the second barrier layer is tantalum nitride.

14. The interconnection structure of claim 10 wherein the thickness of the second barrier layer is about 25 to about 300 Å.

15. An interconnection structure for semiconductor integrated circuits which comprises a layer of copper or copper alloy and a barrier layer of alpha-phase tantalum having a resistivity of about 15 micro-ohm-cm or less, and wherein the thickness of the copper is about 200 to about 1500 Å.

16. An interconnection structure for semiconductor integrated circuits which comprises a layer of copper or copper alloy and a barrier layer of alpha-phase tantalum having a resistivity of about 15 micro-ohm-cm or less, and wherein the thickness of the alpha-phase tantalum layer is about 50 to about 300 Å.

17. The interconnection structure of claim 16 wherein the thickness of the copper is about 200 to about 1500 Å.

* * * * *